(12) United States Patent
Ushikubo

(10) Patent No.: US 10,777,773 B2
(45) Date of Patent: *Sep. 15, 2020

(54) DISPLAY DEVICE

(71) Applicant: Japan Display Inc., Tokyo (JP)

(72) Inventor: Takahiro Ushikubo, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/730,106

(22) Filed: Dec. 30, 2019

(65) Prior Publication Data

US 2020/0136093 A1    Apr. 30, 2020

Related U.S. Application Data

(63) Continuation of application No. 15/916,369, filed on Mar. 9, 2018, now Pat. No. 10,559,781.

(30) Foreign Application Priority Data

Apr. 6, 2017    (JP) .................................. 2017-076070

(51) Int. Cl.
*H01L 51/52*    (2006.01)
*H01L 27/32*    (2006.01)
*H01L 51/56*    (2006.01)

(52) U.S. Cl.
CPC ...... *H01L 51/5265* (2013.01); *H01L 27/3211* (2013.01); *H01L 27/3244* (2013.01); *H01L 51/56* (2013.01); *H01L 2227/323* (2013.01); *H01L 2251/558* (2013.01)

(58) Field of Classification Search
None
See application file for complete search history.

(56) References Cited

U.S. PATENT DOCUMENTS

| | | |
|---|---|---|
| 9,842,886 B2 | 12/2017 | Song et al. |
| 2010/0156280 A1 | 6/2010 | Song et al. |
| 2011/0303903 A1 | 12/2011 | Yoshinaga et al. |
| 2012/0187386 A1 | 7/2012 | Matsumi |
| 2016/0240591 A1 | 8/2016 | Song et al. |
| 2018/0061896 A1 | 3/2018 | Cheng et al. |
| 2018/0248154 A1 | 8/2018 | Shirahase et al. |

FOREIGN PATENT DOCUMENTS

| | | |
|---|---|---|
| JP | 2014-056666 A | 3/2014 |
| WO | 2014/041743 A1 | 3/2014 |

OTHER PUBLICATIONS

U.S. Office Action dated July 23, 2020 for a child U.S. Appl. No. 16/911,481.

*Primary Examiner* — Mounir S Amer
(74) *Attorney, Agent, or Firm* — Michael Best & Friedrich LLP

(57) ABSTRACT

A display device includes a display region arranged above a substrate, a first light emitting element emitting light of a first color, a second light emitting element emitting light of a second color, and a third light emitting element emitting light of a third color arranged in the display region, and a first optical path length adjustment film, a second optical path length adjustment film, and a third optical path length adjustment film in the display region.

15 Claims, 13 Drawing Sheets

DISPLAY DEVICE

CROSS REFERENCE TO RELATED APPLICATIONS

This application is a continuation of U.S. patent application Ser. No. 15/916,369 filed on Mar. 9, 2018. Further, this application is based upon and claims the benefit of priority from the prior Japanese Patent Application No. 2017-076070, filed on Apr. 6, 2017, the entire contents of which are incorporated herein by reference into this application.

FIELD

One embodiment of the present invention is related to an organic EL display device and a method of manufacturing the organic EL display device.

BACKGROUND

Conventionally, as a display device, an organic EL display device (Organic Electroluminescence Display) using an organic electroluminescence material (organic EL material) in a light emitting element (organic EL element) of a display part is known. Unlike a liquid crystal display device or the like, the organic EL display device is a so-called self-light emitting type display device which realizes a display by causing the organic EL material to emit light.

In a top emission type organic EL display device, a microcavity structure which utilizes a resonance effect of light between a reflection electrode as a pixel electrode and a semitransparent electrode as a counter electrode is generally used. In the microcavity structure, EL spectrum peak wavelengths of each color of red, green, and blue (RGB) are made to coincide with an optical path length between the pixel electrode and the counter electrode, and the film thickness of an organic layer between the pixel electrode and the counter electrode is changed in order to extract the strongest light from each color. In this way, it is possible to resonate and emphasize only light having a wavelength which coincides with the optical path length, and it is possible to weaken light having a wavelength which has a misaligned optical path length. Therefore, the spectrum of light extracted to the exterior becomes high intensity, and luminosity and color purity are improved.

In recent years, a structure in which a film for adjusting an optical path length is also arranged above the semitransparent electrode has been examined in order to further improve the efficiency of a display device. For example, a structure has been disclosed in which a high refractive index film and a low refractive index film are alternately stacked above a semitransparent electrode (for example, Japanese Laid Open Patent publication No. 2014-56666).

SUMMARY

A display device according to and embodiment of the present invention includes a display region arranged above a substrate, a first light emitting element emitting light of a first color, a second light emitting element emitting light of a second color, and a third light emitting element emitting light of a third color arranged in the display region, and a first optical path length adjustment film, a second optical path length adjustment film, and a third optical path length adjustment film in the display region. The first optical path length adjustment film has a first region overlapping the first light emitting element, the second light emitting element and the third light emitting element, the second optical path length adjustment film has a second region not overlapping the third light emitting element, and overlapping the first light emitting element and the second light emitting element, and the third optical path length adjustment film has a third region not overlapping the second light emitting element, and overlapping the first light emitting element and the third light emitting element.

A display device according to and embodiment of the present invention includes a display region arranged above a substrate, a first light emitting element emitting light of a first color, a second light emitting element emitting light of a second color, a third light emitting element emitting light of the second color and a fourth light emitting element emitting light of a third color arranged in the display region; and a first optical path length adjustment film, a second optical path length adjustment film, and a third optical path length adjustment film in the display region. The first optical path length adjustment film has a first region overlapping the first light emitting element, the second light emitting element, the third light emitting element and the fourth light emitting element, the second optical path length adjustment film has a second region not overlapping the third light emitting element and the fourth light emitting element, and overlapping the first light emitting element and the second light emitting element, and the third optical path length adjustment film has a third region not overlapping the second light emitting element and the fourth light emitting element, and overlapping the first light emitting element and the third light emitting element.

A manufacturing method according to and embodiment of the present invention includes, forming a first light emitting element emitting light of a first color, a second light emitting element emitting light of a second color, and a third light emitting element emitting light of a third color above a substrate, forming a first optical path length adjustment film above the first light emitting element, the second light emitting element and the third light emitting element, forming a second optical path length adjustment film above the first light emitting element and the second light emitting element, the second optical path length adjustment film serving as an outer side of the third light emitting element, and forming a third optical path length adjustment film above the first light emitting element and the third light emitting element, the third optical path length adjustment film serving as an outer side of the second light emitting element.

DESCRIPTION OF EMBODIMENTS

Figure 1:
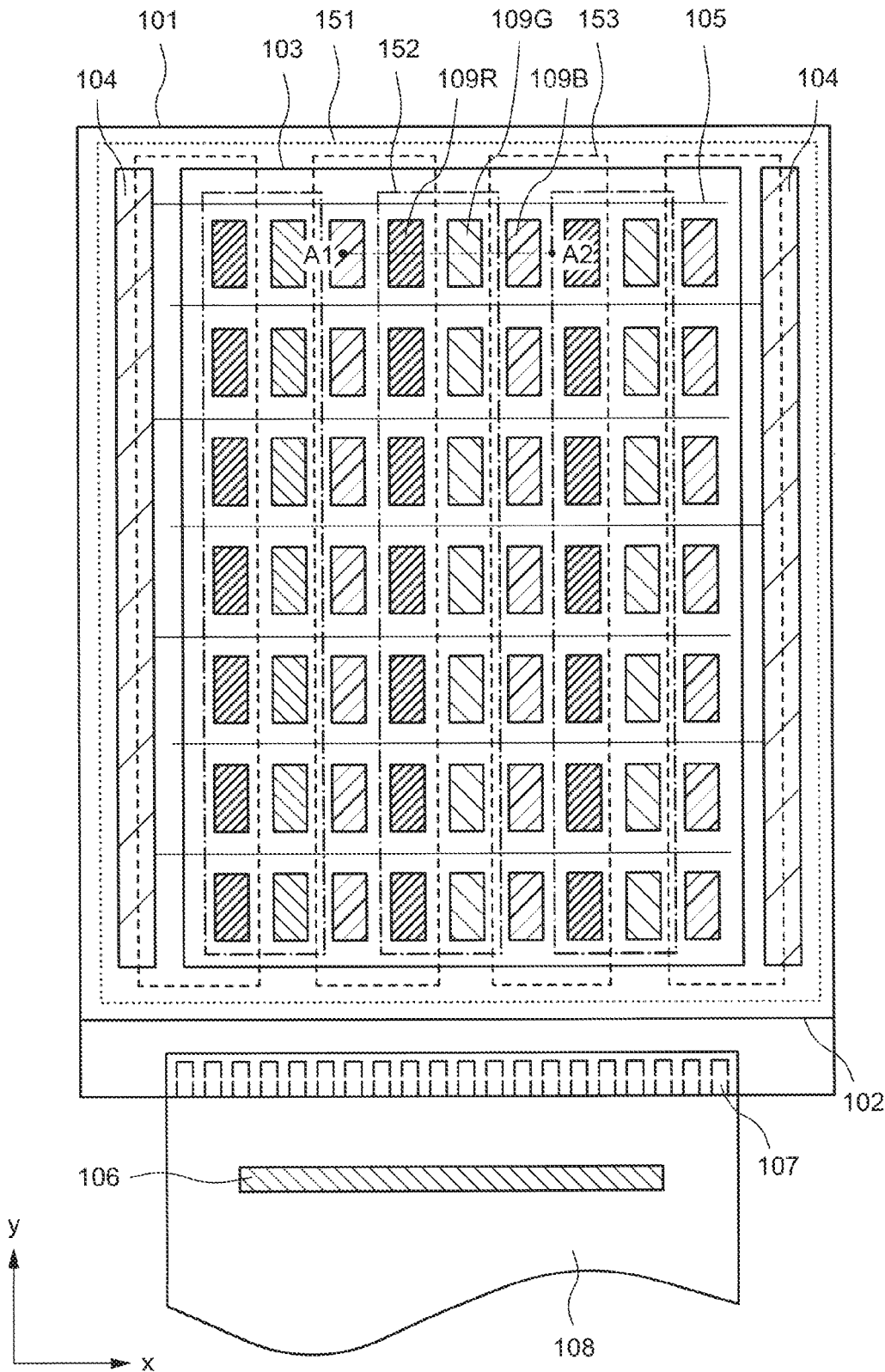
FIG. 1 is a schematic view of a structure of a display device related to one embodiment of the present invention.

The embodiments of the present invention are explained below while referring to the drawings. However, it is possible to perform the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to similar elements and elements that have been mentioned in previous drawings, and therefore a detailed explanation may be omitted where appropriate.

In the present specification and claims, when a plurality of films is formed by processing one film, the films may have functions or rules different from each other. However, the films each originate from a film formed as the same layer in the same process and has the same layer structure and the same material. Therefore, the films are defined as films existing in the same layer.

Furthermore, in the present specification, expressions such as "above" and "below" when explaining the drawings express a relative positional relationship between a structured body in question and other structured bodies. In the present specification, in a side surface view, a direction facing a bank from an insulating surface described later is defined as "upper" and the reverse direction is defined as "below". In the present specification and the scope of the patent claims, in the case of simply describing "above" when expressing a state in which other structured bodies are arranged above a certain structure body, as long as there is no particular limitation, this includes both the case where other structured bodies are arranged directly above in contact with a certain body, and a case where other structured bodies are arranged above a certain body interposed by another structured body.

Furthermore, the ordinals such as "first", "second" and "third" in the present specification are used only for simplifying explanation and should not be interpreted in a limited manner.

First Embodiment

Figure 2:
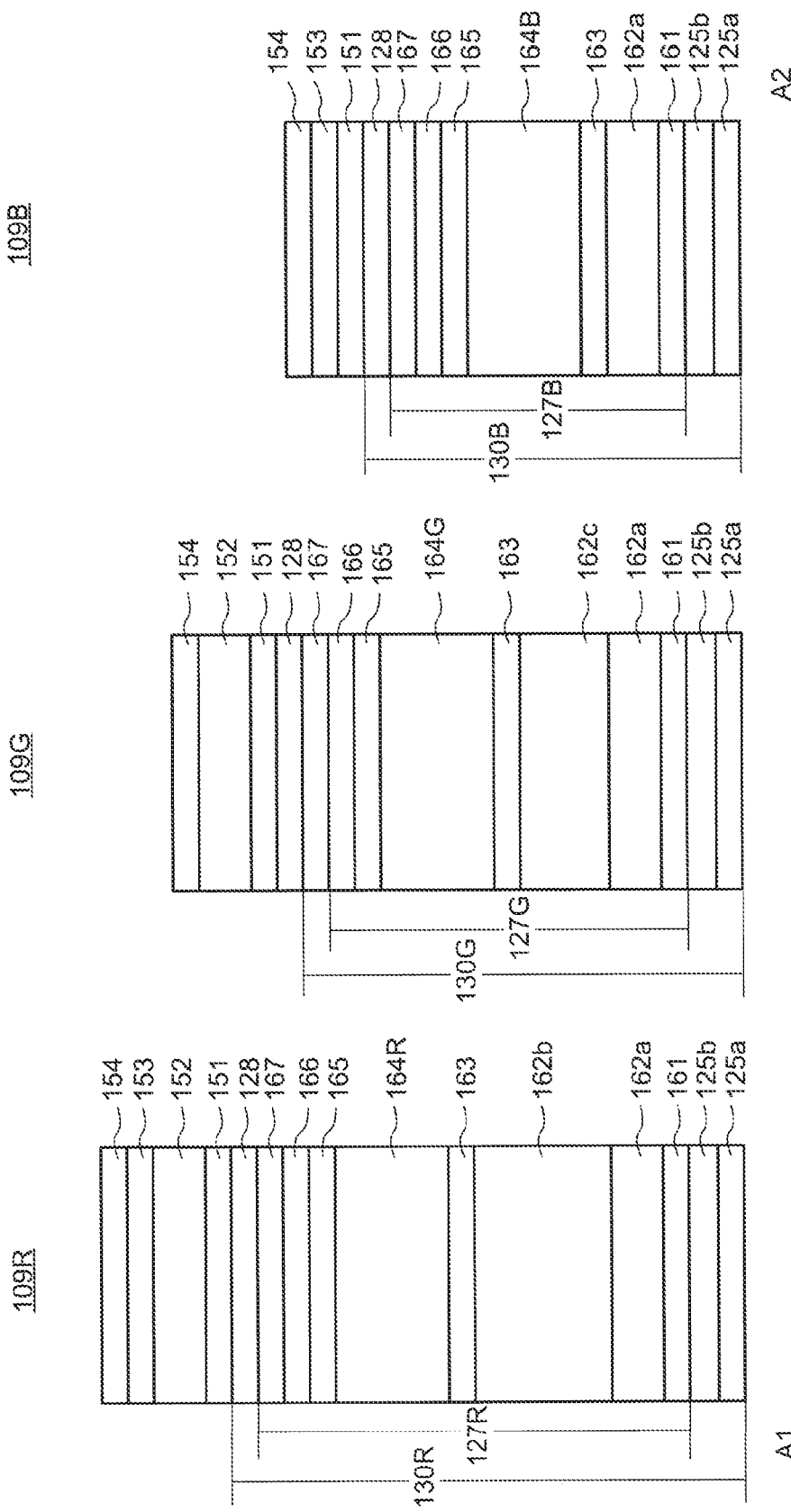
FIG. 2 is a cross-sectional view cut along the line A1-A2 of the display device shown in FIG. 1.

In the present embodiment, a display device according to one embodiment of the present invention is explained referring to FIG. 1 and FIG. 2.

<Structure of Display Device>

FIG. 1 is a schematic view showing a structure of a display device 100 according to one embodiment of the present invention, and shows a schematic structure in the case when the display device 100 is seen in a planar view. In the present specification and the like, a state in which the display device 100 is viewed from a direction perpendicular to the screen (display region) is referred to as "planar view".

As shown in FIG. 1, the display device 100 includes a display region 103, a scanning line drive circuit 104, and a driver IC 106 arranged on an insulating surface. In addition, a counter substrate 102 is arranged above the display region 103 and the scanning line drive circuit 104. A plurality of scanning lines 105 is connected to the scanning line drive circuit 104 in a direction x. The driver IC 106 functions as a control part which provides signals to the scanning line drive circuit 104. A data line drive circuit is incorporated in the driver IC 106. Furthermore, a plurality of data lines is connected to the driver IC 106 in a direction y orthogonal to the direction x, but these are omitted in FIG. 1. In addition, although the driver IC 106 is externally arranged on a flexible printed substrate 108 by a COF (Chip on Film) method, it may also be arranged on the first substrate 101. The flexible printed substrate 108 is connected to terminals 107 arranged in a periphery region 110.

Here, the insulating surface is a surface of the first substrate 101. The first substrate 101 supports each layer forming a transistor or a light emitting element and the like arranged on the surface of the first substrate 101. A glass substrate or a semiconductor substrate and the like can be used as the first substrate 101. In addition, a foldable substrate may be used as the first substrate 101. An organic resin material such as polyimide, acrylic, epoxy, polyethylene terephthalate or the like can be used as the first substrate 101. In addition, it is preferred to use a material that transmits light as the first substrate 101. In addition, the same substrate as the first substrate 101 can be used as the counter substrate 102.

A plurality of pixels are arranged in a matrix shape so as to be along directions (for example, x direction and y direction orthogonal to each other) which intersect each other in the display region 103 shown in FIG. 1. Each of the plurality of pixels has either a first light emitting element emitting light of a first color, a second light emitting element emitting light of a second color and a third light emitting element emitting light of a third color. In the present specification, in the case of a display panel which uses light emitting elements of R (red), G (green), and B (blue), one pixel refers to a region having a light emitting element which emits one of three colors. The color emitted by the light emitting element is not limited to three colors, and may be four or more colors. In FIG. 1, the case of a stripe arrangement in which each of a plurality of red pixels 109R, a plurality of green pixels 109G and a plurality of blue pixels 109B are arranged along first direction (y direction) of the display region 103 is explained.

Each of the pixels 109R, 109G and 109B includes a pixel electrode described later, and a light emitting element comprised from a part of the pixel electrode (anode), an organic layer (light emitting part) including a light emitting layer stacked above the pixel electrode, and a cathode. In FIG. 1, the parts shown as the pixels 109R, 109G and 109B are light emitting regions of a light emitting element. In FIG. 1, although the area of the light emitting region of each pixel is shown to be the same, one embodiment of the present invention is not limited thereto, and the area of the light emitting region may be different for each color.

A video signal is provided to the pixels 109R, 109G 109B from the data line drive circuit incorporated in the driver IC 106. According to these data signals, transistors which are electrically connected to the pixel electrodes arranged in the pixels 109R, 109G and 109B are driven to display a screen according to the image data. Typically, it is possible to use a thin film transistor (TFT) as the transistor. However, it is not limited to a thin film transistor and any element may be used as long as it has a current control function.

A half mirror formed by stacking layers having different refractive indices is arranged above the light emitting element of each pixel. The half mirror forms a resonator together with a pixel electrode having reflective properties. In the present embodiment, a case where an optical path length adjusting film having a high refractive index and an optical path length adjusting film having a low refractive index are arranged above a light emitting element is explained.

The optical path length adjusting film having the high refractive index and the optical path length adjusting film having the low refractive index have different optimum film thicknesses depending on each color. For example, in the optical path length adjustment film having the high refractive index, when the film thickness in the pixel 109R is T1, the film thickness in the pixel 109G is T2, and the film thickness in the pixel 109B is T3, it is preferred that the film thickness relationship T1>T2>T3 is satisfied. However, when each optical path length adjusting film is formed with a common film thickness without using a fine mask, it is impossible to maximize the light emitting efficiency for each light emitting element of each color. In addition, when each optical path length adjusting film is formed with a common film thickness so that the light emitting efficiency of a certain color is maximized, the light emitting efficiency of the other colors decreases.

Therefore, in order to maximize the light emitting efficiency of the light emitting element of each color, it is desirable to pattern the optical path length adjusting film to an optimum film thickness for a light emitting element of each color. However, as the display device becomes higher in definition, patterning the optical path length adjusting film for each light emitting element of each color becomes difficult.

In the present embodiment, the optical path length adjusting film having the high refractive index is divided into three patterns and is structured so that they overlap on light emitting elements of a plurality of colors. FIG. 1 shows a structure in which the optical path length adjusting film having the high refractive index is divided into three patterns, an optical path length adjusting film 151, an optical path length adjusting film 152 and an optical path length adjusting film 153.

The optical path length adjusting film 151 is arranged in the pixels 109R, 109G and 109B as the first pattern. FIG. 1 shows an example in which the optical path length adjusting film 151 is arranged over the entire surface of the display region 103 and is also arranged overlapping the scanning line drive circuit 104. Furthermore, the present invention is not limited to this structure, and the optical path length adjusting film 151 may be arranged at least over the entire surface of the display region 103.

The optical path length adjusting film 152 is arranged above the optical path length adjusting film 151 as the second pattern. In addition, the optical path length adjusting film 152 is arranged in the pixel 109R and the pixel 109G. In addition, the longitudinal direction of the optical path length adjusting film 152 is orthogonal to a first direction (x direction) in which a scanning line 105 connected to the scanning line drive circuit 104 extends.

The optical path length adjusting film 153 is arranged above the optical path length adjusting film 151 and the optical path length adjusting film 152 as a third pattern. In addition, the optical path length adjusting film 153 is arranged in the pixel 109R adjacent to the pixel 109B. The longitudinal direction of the optical path length adjusting film 153 is orthogonal to the first direction in which the scanning line 105 connected to the scanning line drive circuit 104 extends.

By arranging the optical path length adjusting film 151, the optical path length adjusting film 152 and the optical path length adjusting film 153 as described above, in the red pixel 109R, the optical path length adjusting film 151, the optical path length adjusting film 152 and the optical path length adjustment film 153 are stacked. In addition, in the green pixel 109G, the optical path length adjusting film 151 and the optical path length adjusting film 152 are stacked. In addition, in the blue pixel 109B, the optical path length adjusting film 151 and the optical path length adjusting film 153 are stacked.

Here, in the red pixel 109R, the total thickness of the film thickness of the optical path length adjusting film 151, the film thickness of the optical path length adjusting film 152 and the film thickness of the optical path length adjusting film 153 is t1. In addition, the total thickness of the film thickness of the optical path length adjusting film 151 and the film thickness of the optical path length adjusting film 152 in the green pixel 109G is t2. In addition, the total film thickness of the optical path length adjusting film 151 and the film thickness of the optical path length adjusting film 153 in the blue pixel 109B is t3. It is preferable to set the film thicknesses of the optical path length adjusting films 151, 152, 153 so that the relationship between the film thickness t1, the film thickness t2 and the film thickness t3 satisfies t1>t2>t3.

The film thickness of the optical path length adjusting film 151 is set to 20 nm or more and 40 nm or less, the film thickness of the optical path length adjustment film 152 is set to 50 nm or more and 70 nm or less, and the film thickness of the optical path length adjustment film 153 is set to 20 nm or more and 40 nm or less. In the present embodiment, the film thickness of the optical path length adjusting film 152 is made thicker than the each of the film thicknesses of the optical path length adjusting film 151 and the optical path length adjusting film 153. The film thickness of the optical path length adjusting film 151 is set the same as the film thickness of the optical path length adjusting film 153.

As explained above, a structure is provided in which the optical path length adjusting film having the high refractive index is divided into three patterns and is arranged on light emitting elements of a plurality of colors. In this way, even if the optical path length adjusting film having the high refractive index is divided into three patterns for each color so as not to have an optimum film thickness for a light emitting element of each color, it is possible to arrange the optical path length adjusting film so that it has the optimum film thickness a light emitting element of each color. It is possible to obtain a display device with light emitting elements of each color with improved light emitting efficiency.

Furthermore, although not shown in the drawing, the optical path length adjusting film having the low refractive index may be divided into three patterns and arranged above the light emitting elements of a plurality of colors the same as the optical path length adjusting film having the high refractive index.

<Structure of Light Emitting Element and Optical Path Length Adjusting Film>

Next, the structure of a cross section of a light emitting element and the optical path length adjusting film is explained while referring to FIG. 2. FIG. 2 shows a cross-sectional view of the pixel 109R, pixel 109G and pixel 109B. The pixel 109R includes a light emitting element 130R, the pixel 109G includes a light emitting element 130G, and the pixel 109B includes a light emitting element 130B. In addition, the light emitting element 130R includes an organic layer 127R, the light emitting element 130G includes an organic layer 127G, and the light emitting element 130B includes an organic layer 127B.

First, the structures of the light emitting element 130R, the light emitting element 130G and the light emitting element 130B are explained in detail. Each of the pixels 109R, 109G and 109B is arranged with a pixel electrode. The pixel electrode is arranged for each pixel. In addition, in FIG. 3, the pixel electrodes are shown as pixel electrodes 125a and 125b. The pixel electrode 125a is formed from a material having reflective properties and the pixel electrode 125b is formed from a material having translucency.

A hole injection layer 161 is arranged above the pixel electrode 125b. The hole injection layer 161 is arranged in common for the pixels 109R, 109G and 109B.

A hole transport layer is arranged above the hole injection layer 161. It is also preferred to form the hole transport layer into three patterns. The hole transport layer 162a is arranged in common to the pixels 109R, 109G and 109B as the first pattern. In addition, as the second pattern, the hole transporting layer 162b is arranged in a region where the pixel 109R is formed, and as the third pattern, the hole transporting layer 162c is arranged in a region where the pixel 109G is formed. In this way, in the hole transport layer, it is possible to adjust the optical path length by arranging it with a changed film thickness for each color of the light emitting element. In this way, only light having a wavelength matching the optical path length is resonated and emphasized and it is possible to weaken the light with a wavelength whose optical path length is shifted. Therefore, the spectrum of light extracted to the exterior becomes high intensity and luminance and color purity are improved. Here, the hole transporting layer of the pixel 109R is the thickest, the next thickest is the hole transporting layer of the pixel 109G, and the thinnest is the hole transporting layer of the pixel 109B.

An electron blocking layer 163 is arranged above the hole transporting layer. The electron blocking layer 163 is arranged in common with the pixels 109R, 109G and 109B.

Light emitting layers 164R, 164G and 164B are arranged above the electron blocking layer 163. The light emitting layer 164R is arranged in the pixel 109R, the light emitting layer 164G is arranged in the pixel 109G, and the light emitting layer 164B is arranged in the pixel 109B.

A hole blocking layer 165 is arranged above the light emitting layers 164R, 164G and 164B. An electron transporting layer 166 is arranged above the hole blocking layer 165. An electron injecting layer 167 is arranged above the electron transporting layer 166. The hole blocking layer 165, the electron transport layer 166 and the electron injection layer 167 are arranged in common with the pixels 109R, 109G and 109B.

A counter electrode 128 is arranged above the electron injection layer 167. The counter electrode 128 is arranged in common with the pixels 109R, 109G and 109B.

In this way, it is possible to form each of the light emitting elements 130R, 130G and 130B by stacking from the pixel electrode 125a to the counter electrode 128.

In addition, the optical path length adjusting film having the high refractive index and the optical path length adjusting film having the low refractive index are stacked above the light emitting elements 130R, 130G and 130B. The optical path length adjusting film having the high refractive index is formed by the optical path length adjusting film 151, the optical path length adjusting film 152 and the optical path length adjusting film 153. That is, the optical path length adjusting films 151, 152 and 153 are made of the same material having the same refractive index.

The optical path length adjusting film 151 has a region which overlaps the light emitting elements 130R, 130G and 130B. In addition, the optical path length adjusting film 152 is arranged above the optical path length adjusting film 151, and has a region which overlaps the light emitting element 130R and the light emitting element 130B. In addition, the optical path length adjusting film 153 is arranged above the optical path length adjusting film 151 and the optical path length adjusting film 152, and has a region which overlaps the light emitting element 130R and the light emitting element 130B.

In addition, an optical path length adjusting film 154 having the low refractive index is arranged above the optical path length adjusting films 151, 152 and 153 which have the high refractive index. The optical path length adjusting film 154 is arranged in common with the pixels 109R, 109G and 109B.

Although an example in which the optical path length adjusting films 151, 152 and 153 having the high refractive index are stacked in this order is shown in FIG. 2, an embodiment of the present invention is not limited to this example. The stacking order of the optical path length adjusting films 151, 152 and 153 can be appropriately changed.

Second Embodiment

In the present embodiment, a structure of a light emitting element and the optical path length adjusting film which are different from those of the first embodiment are explained while referring to FIG. 3 to FIG. 6. In FIG. 3 to FIG. 6, a structure in which one pixel is formed of four pixels and the four pixels are arranged in a 2×2 square shape is explained.

Figure 3:
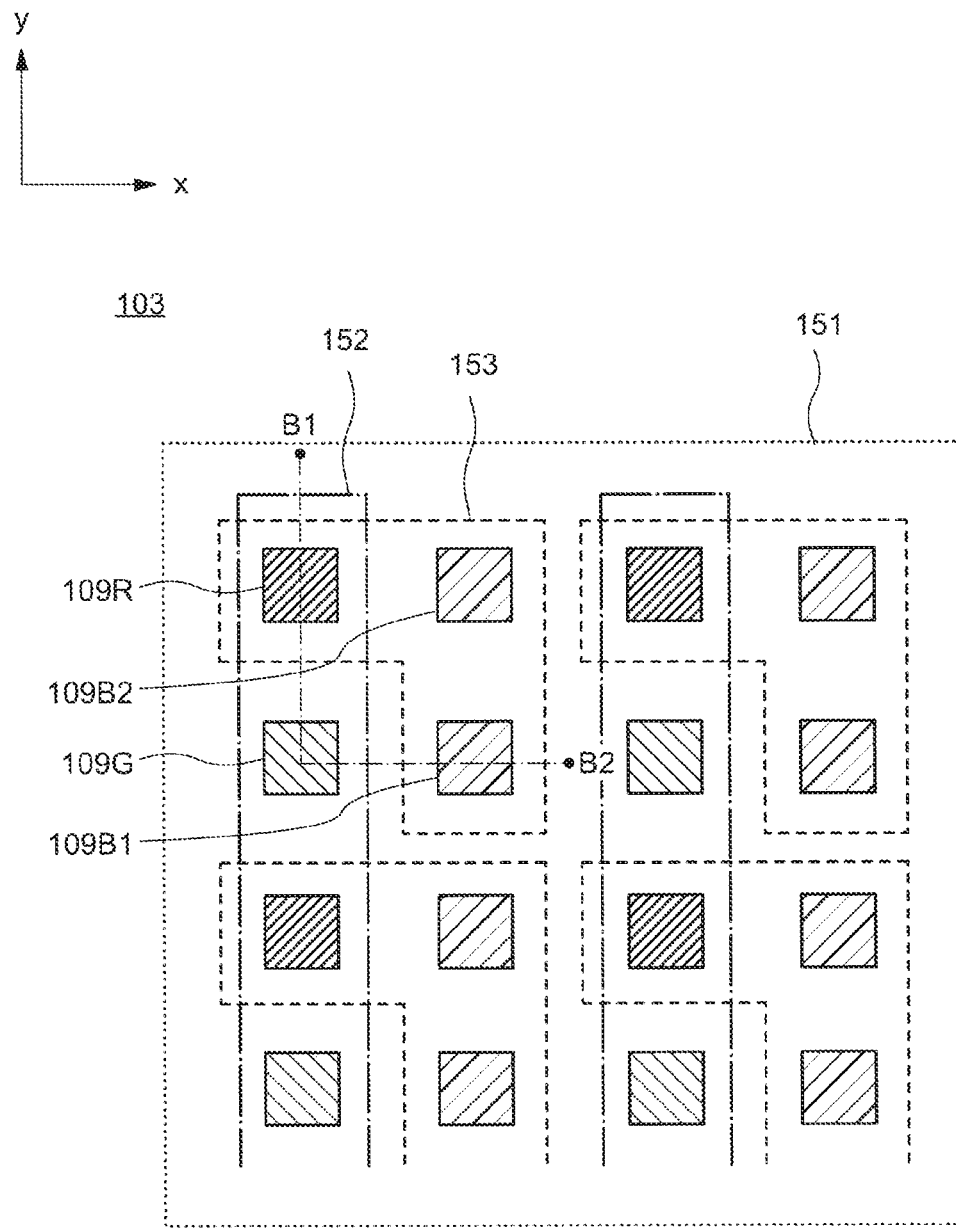
FIG. 3 is a planar expanded view of a part of a display region of a display device related to one embodiment of the present invention.

FIG. 3 is a diagram showing a part of a pixel arranged in the display region 103. In FIG. 3, four pixels, a red pixel 109R, a green pixel 109G, and blue pixels 109B1 and 130B2 are shown. Furthermore, in FIG. 3, sections shown as the red pixel 109R, the green pixel 109G, and the blue pixels 109B1, 109B2 are light emitting regions of a light emitting element. In addition, with respect to the optical path length adjusting film, optical path length adjusting films 151, 152 and 153 having high refractive indices are shown, and an illustration of the optical path length adjusting film 154 having the low refractive index is omitted.

In addition, in FIG. 3 to FIG. 6, the film thickness of the optical path length adjusting film 151 is set to 20 nm or more and 40 nm or less, the film thickness of the optical path length adjusting film 152 is set to 50 nm or more and 70 nm or less, and the film thickness of the optical path length adjusting film 153 is set to 20 nm or more and 40 nm or less. In the present embodiment, the film thickness of the optical path length adjusting film 152 is made thicker than each of the film thicknesses of the optical path length adjusting film 151 and the optical path length adjusting film 153. The film thickness of the optical path length adjusting film 151 is set the same as the film thickness of the optical path length adjusting film 152.

In addition, since the cross-sectional views of the light emitting element and the optical path length adjusting film in the dotted line B1-B2 shown in FIG. 3 to FIG. 6 are the same as the cross-sectional views of the light emitting element and the optical path length adjusting film shown in FIG. 2, an illustration is omitted.

The optical path length adjusting film 151 is arranged in the pixels 109R, 109G, 109B1 and 109B2 as the first pattern. In addition, in the pixel structure shown in FIG. 3, the optical path length adjusting film 151 is arranged over the entire surface of the display region 103. Although not shown in the diagrams, at least a part of the optical path length adjusting film 151 may overlap the scanning line drive circuit 104 shown in FIG. 1.

The optical path length adjusting film 152 is arranged above the optical path length adjusting film 151 as the second pattern. In addition, the optical path length adjusting film 152 is arranged in the pixel 109R and the pixel 109G. The longitudinal directions of the second optical path length adjusting film and the third optical path length adjusting film are arranged along one direction (y direction).

The optical path length adjusting film 153 is arranged above the optical path length adjusting film 151 and the optical path length adjusting film 152 as the third pattern. In addition, the optical path length adjusting film 153 is arranged in the pixel 109R, and the pixels 109B1 and 109B2. The optical path length adjusting film 153 is arranged for each pixel.

Figure 4:
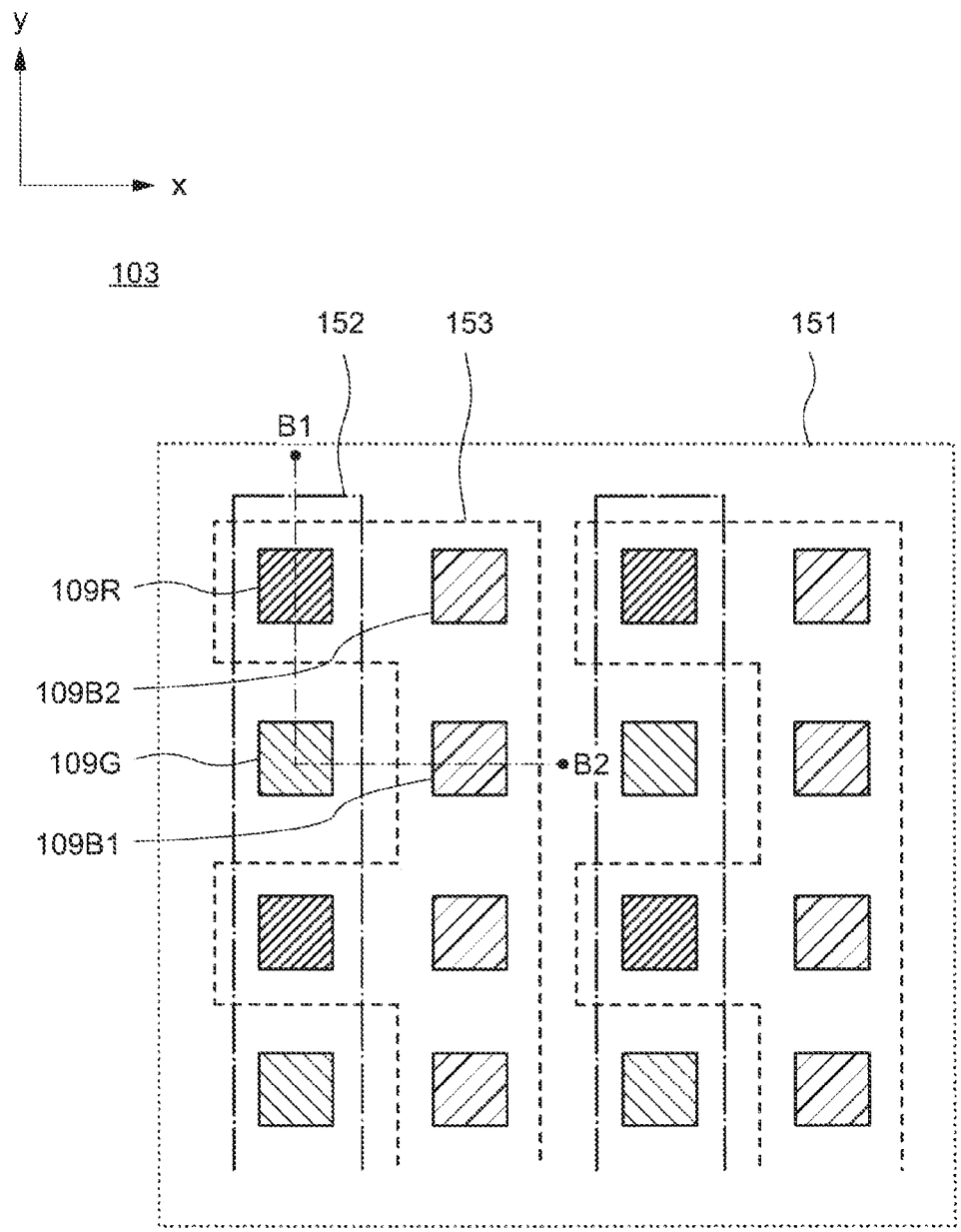
FIG. 4 is a planar expanded view of a part of a display region of a display device related to one embodiment of the present invention.

Although an example in which the optical path length adjusting film 153 is arranged for each pixel is shown in FIG. 3, one embodiment of the present invention is not limited to this example. For example, as shown in FIG. 4, it is possible to be arranged connected to vertically adjacent pixels. The longitudinal direction of the optical path length adjusting film 153 is along a second direction (y direction) orthogonal to the first direction (x direction) in which the scanning line 105 connected to the scanning line drive circuit 104 extends. The pixels 109B1 and 109B2 overlap, and at least a part of the optical path length adjusting film 153 overlaps the pixel 109R in the longitudinal direction of the optical path length adjusting film 153. By adopting a structure in which the optical path length adjusting film 153 extends in the longitudinal direction of the optical path length adjusting film 153, patterning of the optical path length adjusting film 153 becomes easier, which is preferable.

Figure 5:
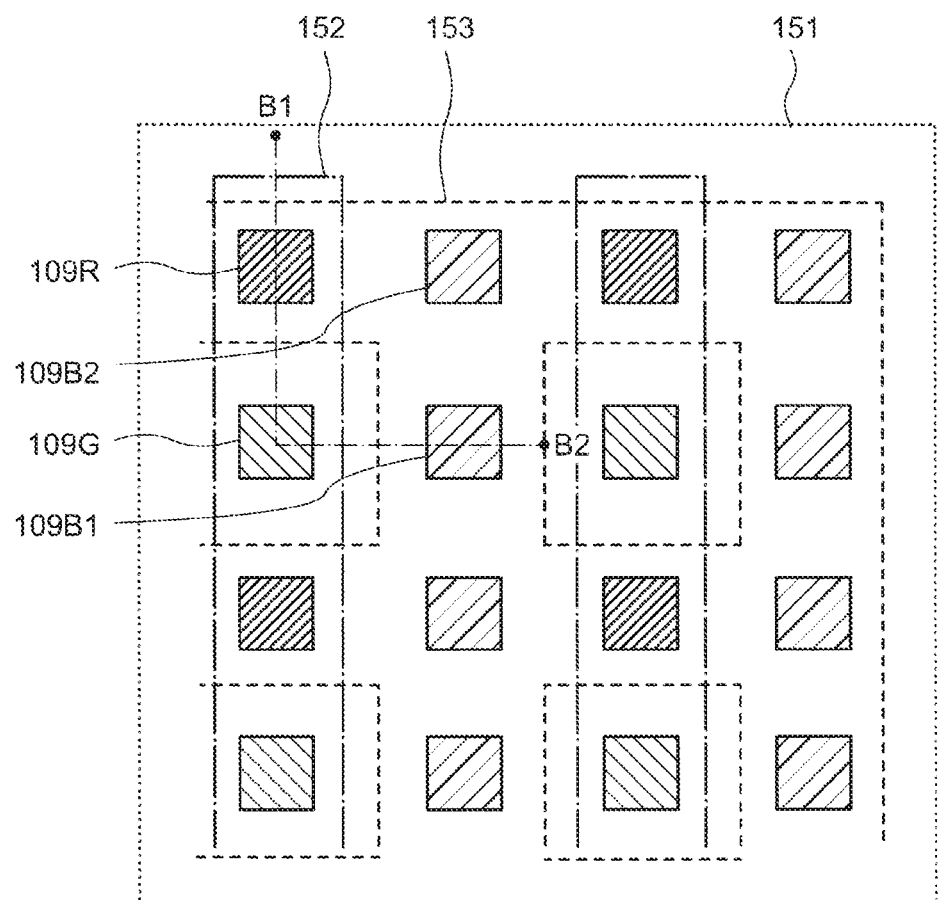
FIG. 5 is a planar expanded view of a part of a display region of a display device related to one embodiment of the present invention.

In addition, as shown in FIG. 5, it is possible to arrange the optical path length adjusting film 153 not only vertically adjacent but also connected to pixels adjacent horizontally. That is, the optical path length adjusting film 153 can have a shape having an opening in a region which overlaps the green pixel 109G. By forming the optical path length adjusting film 153 having an opening in a region which overlaps the green pixel 109G, patterning of the optical path length adjusting film 153 becomes easier compared with the shape shown in FIG. 4, which is preferable.

Figure 6:
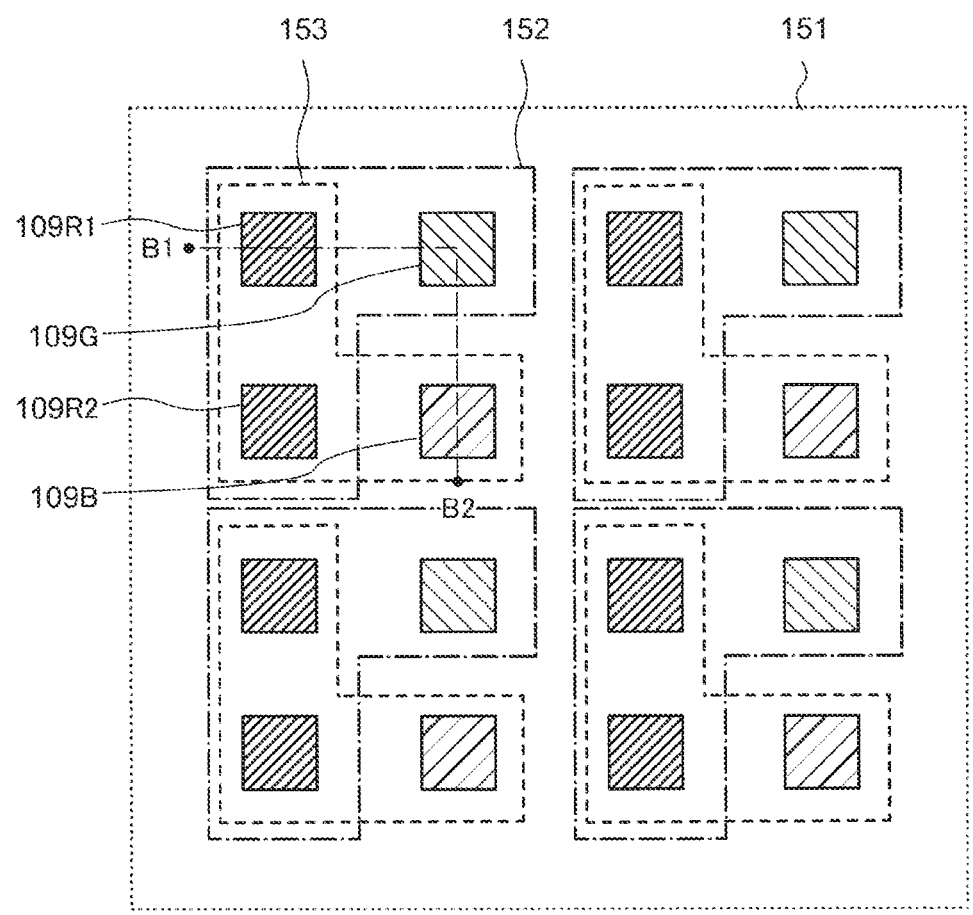
FIG. 6 is a planar expanded view of a part of a display region of a display device related to one embodiment of the present invention.

FIG. 6 is a diagram showing a part of a pixel arranged in the display region 103. In FIG. 6, four pixels, red pixels 109R1 and 109R2, the green pixel 109G, and the blue pixel 109B are shown. In FIG. 6, sections shown as the red pixels 109R1, 109R2, the green pixel 109G and the blue pixel 109B are light emitting regions of a light emitting element. In addition, with respect to the optical path length adjusting film, optical path length adjusting films 151, 152, and 153 having high refractive indices are shown, and illustration of the optical path length adjusting film 154 having the low refractive index is omitted.

The optical path length adjusting film 151 is arranged in the pixels 109R1, 109R2, 109G and 109B as the first pattern. In addition, in the pixel structure shown in FIG. 6, an example is shown in which the optical path length adjusting film 151 is arranged on the entire surface of the display region 103. Although not shown in the diagram, at least a part of the optical path length adjusting film 151 may overlap the scanning line drive circuit 104 shown in FIG. 1.

The optical path length adjusting film 152 is arranged above the optical path length adjusting film 151 as the second pattern. In addition, the optical path length adjusting film 152 is arranged in the pixels 109R1 and 109R2 and the pixel 109G.

The optical path length adjusting film 153 is arranged above the optical path length adjusting film 151 and the optical path length adjusting film 152 as the third pattern. In addition, the optical path length adjusting film 153 is arranged in the pixels 109R1 and 109R2 and the pixel 109B.

As explained above, the optical path length adjusting film having the high refractive index is divided into three patterns and is arranged above light emitting elements of a plurality of colors. In this way, even if the optical path length adjusting film which has the high refractive index is divided into three patterns for each color so as not to have an optimum film thickness for the light emitting element of each color, it is possible to provide the optical path length adjusting film having the optimum film thickness in a light emitting element of each color. It is possible to obtain a display device having light emitting elements of each color with improved light emitting efficiency.

Third Embodiment

Figure 7:
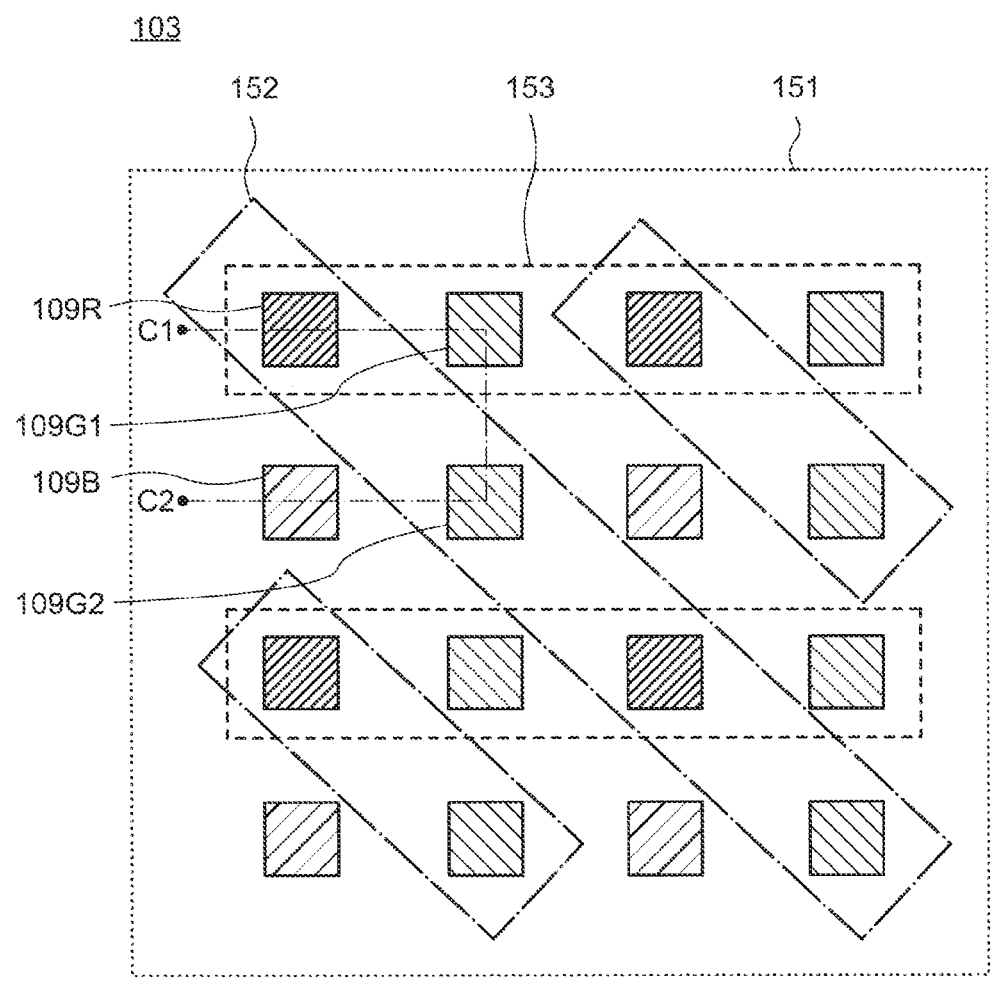
FIG. 7 is a planar expanded view of a part of a display region of a display device related to one embodiment of the present invention.
Figure 8:
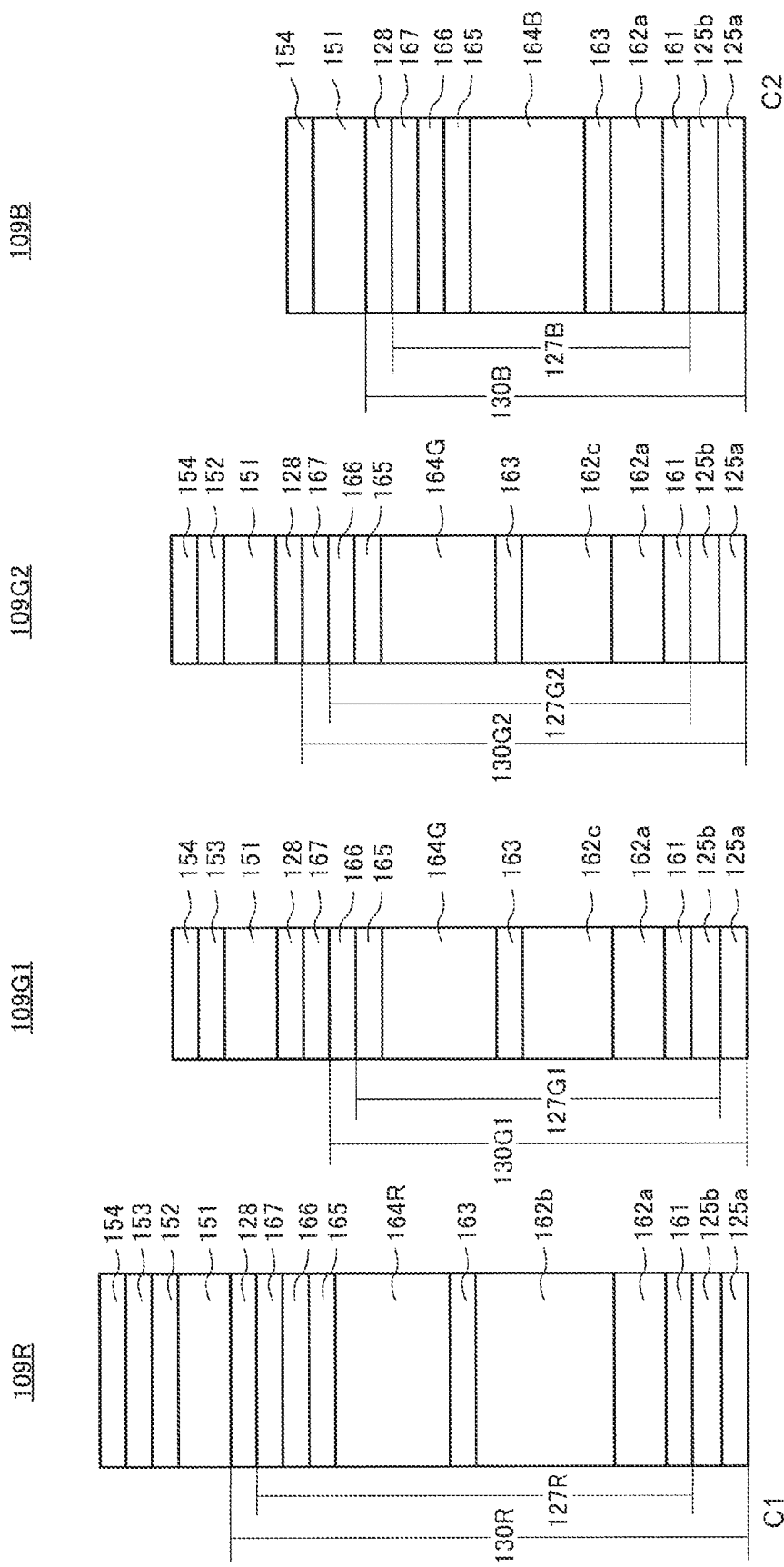
FIG. 8 is of a cross-sectional view cut along the line C1-C2 of the display device shown in FIG. 1.
Figure 9:
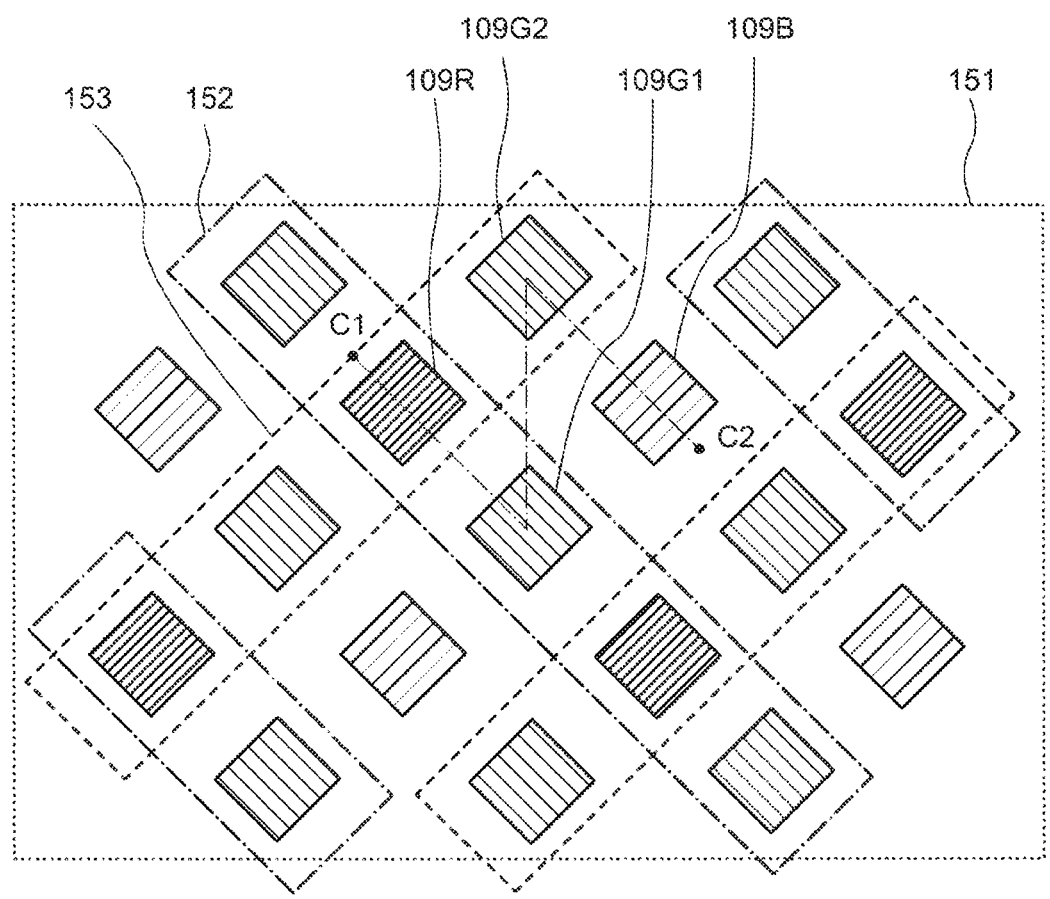
FIG. 9 is a planar expanded view of a part of a display region of a display device related to one embodiment of the present invention.

In the present embodiment, a structure of a light emitting element and the optical path length adjusting film different from those in the second embodiment is explained while referring to FIG. 7 to FIG. 9. In FIG. 7 to FIG. 9, a structure in which one pixel is formed by four pixels and the four pixels are arranged in a square of 2×2 is explained.

FIG. 7 is a diagram showing a part of a pixel arranged in the display region 103. In FIG. 7, four pixels, the red pixel 109R, green pixels 109G1 and 109G2, and the blue pixel 109B are shown. Here, the red pixel 109R and the green pixel 109G1 are arranged along one direction (x direction). In FIG. 7, sections shown as the red pixel 109R, the green pixel 109G1, 109G2, and the blue pixel 109B are light emitting regions of a light emitting element. In addition, with respect to the optical path length adjusting film, the optical path length adjusting films 151, 152 and 153 which have high refractive indices are shown and an illustration of the optical path length adjusting film 154 which has the low refractive index is omitted.

Here, in the red pixel 109R, the total thickness of the film thickness of the optical path length adjusting film 151, the film thickness of the optical path length adjusting film 152 and the film thickness of the optical path length adjusting film 153 is t1. In addition, the total film thickness of the optical path length adjusting film 151 and the film thickness of the optical path length adjusting film 153 in the green pixel 109G1 is t2. In addition, the total film thickness of the optical path length adjusting film 151 and the film thickness of the optical path length adjusting film 152 in the green pixel 109G2 is t3. In addition, the film thickness of the optical path length adjusting film 151 in the blue pixel 109B is t4. It is preferred to set each of the film thicknesses of the optical path length adjusting films 151, 152 and 153 so that the relationship between the film thickness t1, the film thickness t2, the film thickness t3 and the film thickness t4 satisfies t1>t2=t3>t4.

In addition, in FIG. 7 to FIG. 9, the film thickness of the optical path length adjusting film 151 is 50 nm or more and 70 nm or less, the film thickness of the optical path length adjusting film 152 is 20 nm or more and 40 nm or less, and the film thickness of the optical path length adjusting film 153 is 20 nm or more and 40 nm or less. In the present embodiment, the film thickness of the optical path length adjusting film 151 is made thicker than each of the film thicknesses of the optical path length adjusting film 152 and the optical path length adjusting film 153. In addition, the film thickness of the optical path length adjusting film 152 is set to be the same as the film thickness of the optical path length adjusting film 153.

The optical path length adjusting film 151 is arranged in the pixels 109R, 109G1, 109G2 and 109B as the first pattern. In addition, in the pixel structure shown in FIG. 7, the optical path length adjusting film 151 is arranged on the entire surface of the display region 103. Although not shown in the diagram, at least a part of the optical path length adjusting film 151 may overlap the scanning line drive circuit 104 shown in FIG. 1.

The optical path length adjusting film 152 is arranged above the optical path length adjusting film 151 as the second pattern. In addition, the optical path length adjusting film 152 is arranged in the pixels 109R and 109G2. The optical path length adjusting film 152 is arranged so that the angle between the longitudinal direction of the optical path length adjusting film 152 and one direction (x) of the display region 103 is 35° or more and 55° or less.

The optical path length adjusting film 153 is arranged above the optical path length adjusting film 151 and the optical path length adjusting film 152 as the third pattern. In addition, the optical path length adjusting film 153 is arranged in the pixel 109R and the pixel 109G1. The optical path length adjusting film 153 is arranged so that the longitudinal direction of the optical path length adjusting film 153 is parallel to one direction (x direction) of the display region.

<Structure of Light Emitting Element and Optical Path Length Adjusting Film>

Next, a cross-sectional structure of the light emitting element and the optical path length adjusting film in the dotted line C1-C2 in FIG. 7 is explained while referring to FIG. 8. FIG. 8 is a cross-sectional view of the pixel 109R, the pixels 109G1, 109G2, and the pixel 109B. The pixel 109R has a light emitting element 130R, the pixel 109G1 has a light emitting element 130G1, the pixel 109G2 has a light emitting element 130G2, and the pixel 109B has the light emitting element 130B. In addition, the light emitting element 130R has the organic layer 127R, the light emitting element 130G1 has an organic layer 127G1, the light emitting element 130G2 has an organic layer 127G2, and the light emitting element 130B has the organic layer 127B.

Since the structure shown in FIG. 7 is different from the structure shown in FIG. 2, and the film thickness of the optical path length adjusting film 151 and the optical path length adjusting film 152, and the structure of the pixels 109G1 and 109G2 are only partially different, only the different parts are explained in detail.

The optical path length adjusting film 151 has a region which overlaps with the light emitting elements 130R, 130G1, 130G2 and 130B. In addition, the optical path length adjusting film 152 is arranged above the optical path length adjusting film 151 and has a region which overlaps with the light emitting element 130R and the light emitting element 130G2. In addition, the optical path length adjusting film 153 is arranged above the optical path length adjusting film 151 and the optical path length adjusting film 152 and has a region which overlaps the light emitting element 130R and the light emitting element 130G1.

The optical path length adjusting film 154 which has the low refractive index is arranged above the optical path length adjusting films 151, 152 and 153 which have the high refractive index. The optical path length adjusting film 154 is arranged in common with the pixels 109R, 109G and 109B.

In FIG. 8, although an example in which the optical path length adjusting films 151, 152 and 153 having the high refractive index are stacked in this order is shown, an embodiment of the present invention is not limited to this example. The stacking order of the optical path length adjusting films 151, 152 and 153 can be appropriately changed.

Next, a structure different from the arrangement of pixels arranged in the display region 103 shown in FIG. 7 is explained while referring to FIG. 9. In FIG. 9, in a pixel, the direction in which one side of a light emitting region extends is arranged so as to intersect a first direction in which the scanning line 105 connected to the scanning line drive circuit 104 extends.

The optical path length adjusting film 151 is arranged in the pixels 109R, 109G1, 109G2 and 109B as the first pattern. In addition, in the pixel structure shown in FIG. 9, the optical path length adjusting film 151 is arranged over the entire surface of the display region 103. Although not shown in the diagram, at least a part of the optical path length adjusting film 151 may overlap the scanning line drive circuit 104 shown in FIG. 1.

The optical path length adjusting film 152 is arranged over the optical path length adjusting film 151 as the second pattern. In addition, the optical path length adjusting film 152 is arranged in the pixel 109R and the pixel 109G1. The optical path length adjusting film 152 is arranged so that the angle formed by the longitudinal direction of the optical path length adjusting film 152 and one direction (x direction) of the display region 103 is 35° or more and 55° or less.

The optical path length adjusting film 153 is arranged over the optical path length adjusting film 151 and the optical path length adjusting film 152 as the third pattern. In addition, the optical path length adjusting film 153 is arranged in the pixels 109R and 109G2. The optical path length adjusting film 153 is arranged so that the angle between the longitudinal direction of the optical path length adjusting film 153 and one direction (x direction) of the display region 103 is 35° or more and 55° or less. In addition, the longitudinal direction of the optical path length adjusting film 153 and the longitudinal direction of the optical path length adjusting film 152 intersect each other, and the optical path length adjusting film 153 and the optical path length adjusting film 152 overlap each other above the pixel 109R.

As explained above, the optical path length adjusting film which has the high refractive index is divided into three patterns and is arranged above light emitting elements of a plurality of colors. In this way, even if the optical path length adjusting film having the high refractive index is divided into three patterns for each color so as not to have an optimum film thickness for the light emitting element of each color, it is possible to arrange the optical path length adjusting film having the optimum film thickness in a light emitting element of each color. A display device can be obtained with light emitting elements of each color with improved light emitting efficiency.

<Manufacturing Method of Display Device>

A method of manufacturing a display device according to one embodiment of the present invention is explained while referring to FIG. 10 to FIG. 13. FIG. 10 to FIG. 13 are diagrams showing a structure of a cross-section cut along the line A1-A2 of the display region 103 shown in FIG. 1. FIG. 10 to FIG. 13 show cross sections of three pixels 109R, 109G and 109B as a part of the display region 103.

Figure 10:
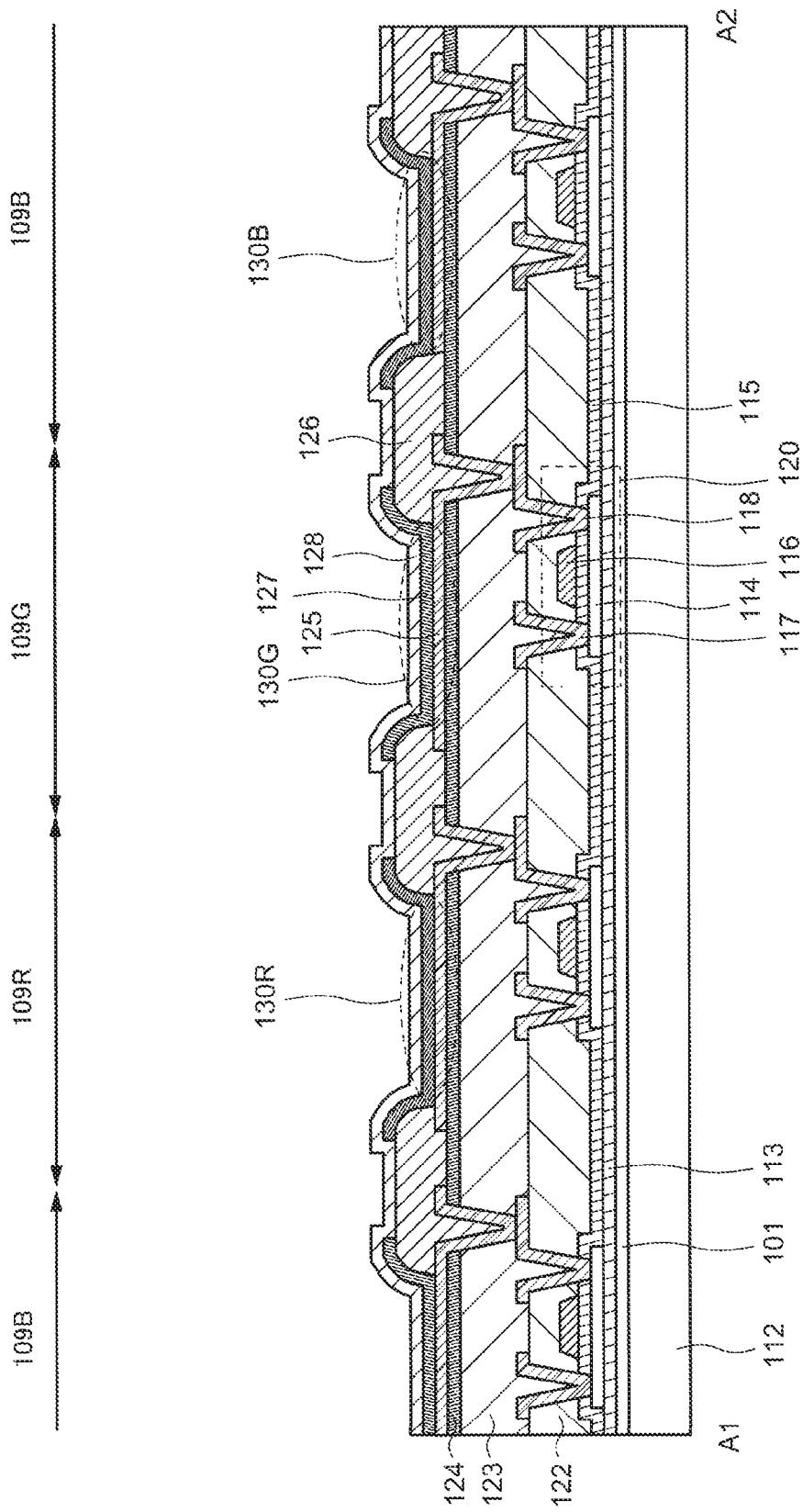
FIG. 10 is a cross-sectional view for explaining a manufacturing method of a display device related to one embodiment of the present invention.

As shown in FIG. 10, a first substrate 101 and a second substrate 112 are used in the display device 100. A glass substrate, a quartz substrate, or a flexible substrate (polyimide, polyethylene terephthalate, polyethylene naphthalate, triacetyl cellulose, cyclic olefin copolymer, cycloolefin polymer, other resin substrate having flexibility) can be used as the first substrate 101 and the second substrate 112. In the case when it is not necessary for the first substrate 101 and the second substrate 112 to have translucency, it is also possible to use a metal substrate, a ceramic substrate or a semiconductor substrate. In the present embodiment, polyimide is used as the first substrate 101 and polyethylene terephthalate is used as the second substrate 112.

An underlying layer 113 is formed above the first substrate 101. The underlying layer 113 is an insulating layer made of an inorganic material such as silicon oxide, silicon nitride or aluminum oxide or the like. The underlying layer 113 is not limited to a single layer and may have a stacked laminated structure in which, for example, a silicon oxide layer and a silicon nitride layer are combined. This structure may be appropriately determined considering adhesion to the first substrate 101 and gas barrier properties to a transistor 120 described later.

A transistor 120 is formed above the underlying layer 113. The structure of the transistor 120 may be a top gate type or a bottom gate type. In the present embodiment, the transistor 120 includes a semiconductor layer 114 arranged above the underlying layer 113, a gate insulating film 115 covering the semiconductor layer 114, and a gate electrode 116 arranged above the gate insulating film 115. In addition, an interlayer insulating layer 122 which covers the gate electrode 116 is arranged above the transistor 120. Source or drain electrodes 117 and 118 are arranged above the interlayer insulating layer 122. Source or drain electrodes 117 and 118 are respectively connected to the semiconductor layer 114. Furthermore, although an example in which the interlayer insulating layer 122 has a single layer structure is explained in the present embodiment, the interlayer insulating layer 122 may also have a stacked structure.

Furthermore, the material of each layer forming the transistor 120 may be any known material and is not particularly limited. For example, generally, polysilicon, amorphous silicon or an oxide semiconductor can be used as the semiconductor layer 114. Silicon oxide or silicon nitride can be used as the gate insulating film 115. The gate electrode 116 is made of a metal material such as copper, molybdenum, tantalum, tungsten or aluminum. Silicon oxide or silicon nitride can be used as the interlayer insulating layer 122. The source or drain electrode 117 and the source or drain electrode 118 are each made of a metal material such as copper, titanium, molybdenum or aluminum.

Although not shown in FIG. 10, it is possible to arrange a first wiring made of the same metal material as the metal material forming the gate electrode 116 in the same layer as the gate electrode 116. The first wiring can be arranged as, for example, a scanning line driven by the scanning line drive circuit 104 or the like. Although not shown in FIG. 10, a second wiring extending in a direction which intersects the first wiring can be arranged in the same layer as the source or drain electrode 117 and the source or drain electrode 118. The second wiring can be arranged, for example, as a data line driven by the data line drive circuit or the like.

A planarization film 123 is formed above the transistor 120. The planarization film 123 is formed including an organic resin material. For example, known organic resin materials such as polyimide, polyamide, acrylic, epoxy and the like can be used as the organic resin material. These materials are capable of forming a film by a solution coating method and are characterized by a high flattening effect. Although not specifically shown, the planarization film 123 is not limited to a single layer structure, and may have a stacked layer structure of a layer containing an organic resin material and an inorganic insulating layer.

A contact hole which exposes a part of the source or drain electrode 118 is formed in the planarization film 123. The contact hole is an aperture part for electrically connecting a pixel electrode 125 described later and the source or drain electrode 118. Therefore, the contact hole is arranged so as to overlap a part of the source electrode or the drain electrode 118. The source or drain electrode 118 is exposed at the bottom surface of the contact hole.

A protective film 124 is formed above the planarization film 123. The protective film 124 overlaps the contact hole formed in the planarization film 123. The protective film 124 is preferred to have a barrier function against moisture and oxygen, and is formed using, for example, an inorganic insulating material such as a silicon nitride or aluminum oxide.

A pixel electrode 125 is formed above the protective film 124. The pixel electrode 125 is electrically connected to the source electrode or the drain electrode 118 via a contact hole arranged in the protective film 124 and the planarization film 123. In the display device 100 of the present embodiment, the pixel electrode 125 functions as an anode which forms the light emitting element 130. The pixel electrode 125 has a different structure depending on whether it is a top emission type or a bottom emission type. For example, in the case of a top emission type, either a metal film having a high reflectance is used as the pixel electrode 125, or a stacked structure of a transparent conductive film having a high work function such as an indium oxide based transparent conductive layer (for example, ITO) or zinc oxide based transparent conductive (for example, IZO, ZnO) and a metal film is used as shown in FIG. 2 and FIG. 8. On the other hand, in the case of a bottom emission type, the transparent conductive layer described above is used as the pixel electrode 125. In the present embodiment, a top emission type organic EL display device is explained as an example.

A first insulating layer 126 made of an organic resin material is formed above the pixel electrode 125. A known resin material such as polyimide, polyamide, acrylic, epoxy or siloxane can be used as the organic resin material. The first insulating layer 126 has an aperture part in a part above the pixel electrode 125. The first insulating layer 126 is arranged to cover an end part (edge part) of the pixel electrode 125 between adjacent pixel electrodes 125, and functions as a member which separates adjacent pixel electrodes 125. Therefore, the first insulating layer 126 is also generally referred to as a "partition wall" or "bank". A part of the pixel electrode 125 exposed from the first insulating layer 126 is a light emitting region of the light emitting element 130. It is preferred that the inner wall of the aperture part of the first insulating layer 126 has a tapered shape. In this way, it is possible to reduce coverage defects at the end part of the pixel electrode 125 when forming a light emitting layer described later. The first insulating layer 126 may not only cover the end part of the pixel electrode 125 but also function as a filling material which fills a concave part caused by the contact hole of the planarization film 123 and the protective film 124.

An organic layer 127 is formed above the pixel electrode 125. The organic layer 127 has at least a light emitting layer formed from an organic material and functions as a light emitting part of the light emitting element 130. In addition to the light emitting layer, the organic layer 127 includes various layers such as a hole injection layer and/or hole transport layer, an electron injection layer and/or electron transport layer explained in FIG. 2 and FIG. 8. The organic layer 127 is arranged to cover the light emitting region, that is, to cover the aperture part of the first insulating layer 126 in the light emitting region.

Furthermore, in the present embodiment, by arranging the organic layer 127 including a light emitting layer which emits light of a desired color, and forming an organic layer 127 including different light emitting layers above each pixel electrode 125, a structure is obtained in which each color of RGB is displayed. That is, in the present embodiment, the light emitting layer of the organic layer is discontinuous between adjacent pixel electrodes 125. A known structure or a known material can be used as the organic layer 127 and is not particularly limited to the structure of this embodiment.

The counter electrode 128 is formed above the organic layer 127 and the first insulating layer 126. The counter electrode 128 functions as a cathode forming the light emitting element 130. Since the display device 100 of the present embodiment is a top emission type, a transparent electrode is used as the counter electrode 128. An MgAg thin film or a transparent conductive layer (ITO or IZO) is used as the thin film forming the transparent electrode. The counter electrode 128 is also arranged above the first insulating layer 126 so as to bridge across the pixels 109R, 109G and 109B. The counter electrode 128 is electrically connected to an external terminal via a lower conductive layer in a periphery region near the end of the display region 103. As described above, in the present embodiment, the light emitting element 130 is formed by a part (anode) of the pixel electrode 125 exposed from the first insulating layer 126, the organic layer (light emitting part) and the counter electrode 128 (cathode).

Figure 11:
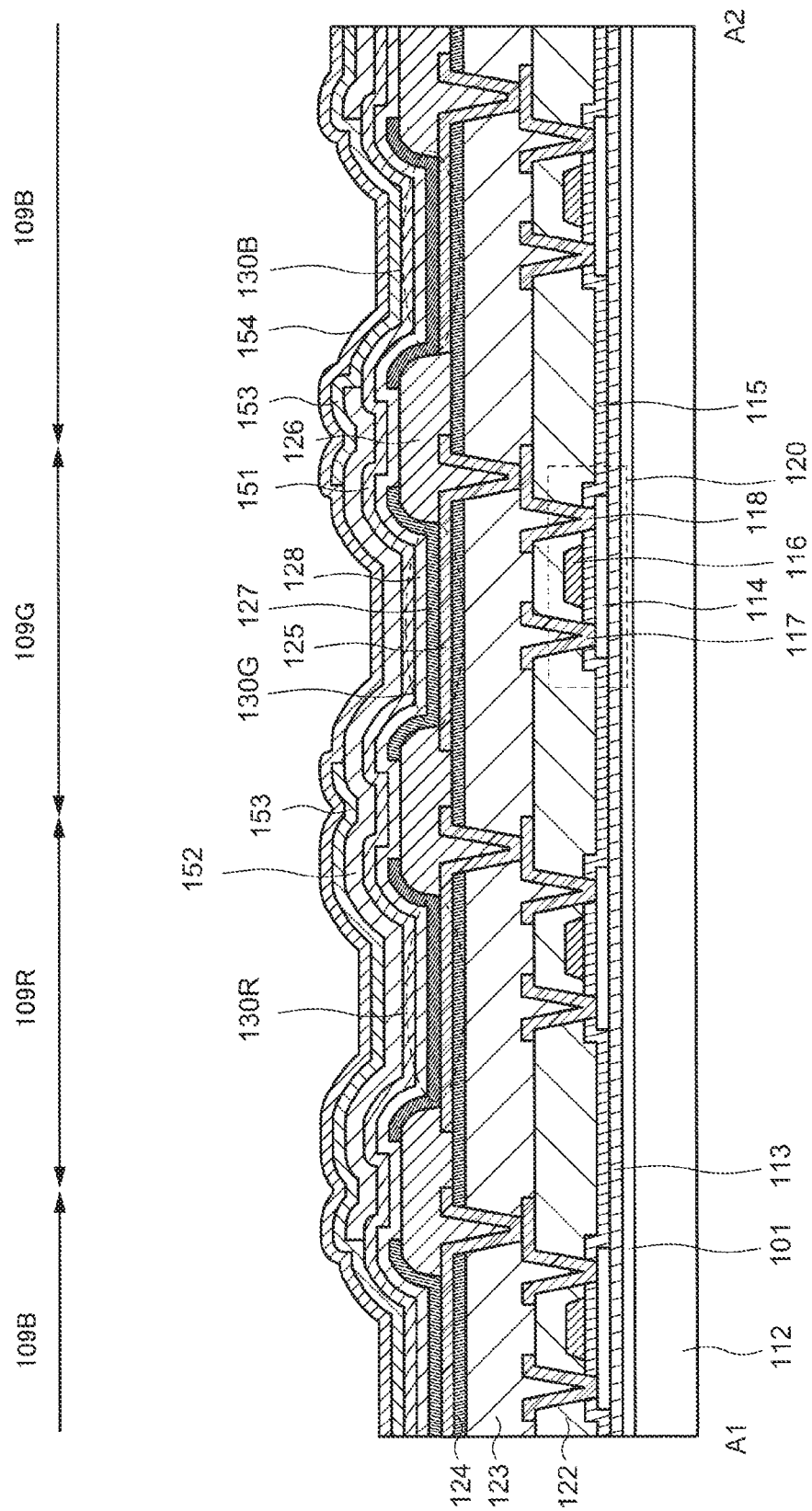
FIG. 11 is a cross-sectional view for explaining a manufacturing method of a display device related to one embodiment of the present invention.

Next, as shown in FIG. 11, in the pixels 109R, 109G and 109B, the optical path length adjusting films 151, 152 and 153 having the high refractive index and the optical path length adjusting film 154 having the low refractive index are formed above each light emitting element.

The optical path length adjusting film 151 is formed above the light emitting element 130R, the light emitting element 130G and the light emitting element 130B, the optical path length adjusting film 152 is formed above the light emitting element 130R and the light emitting element 130G, and the optical path length adjusting film 153 is formed above the light emitting element 130R and the light emitting element 130B. In addition, the optical path length adjusting film 154 is formed above the light emitting element 130R, the light emitting element 130G and the light emitting element 130B.

For example, it is possible to use a general organic material or a transparent oxide such as ITO as the optical path length adjusting films 151, 152 and 153. The refractive indexes of the optical path length adjusting films 151, 152 and 153 are preferably, for example, 1.6 to 2.6. The optical path length adjusting films 151, 152 and 153 are arranged using a material having the same refractive index. In addition, it is preferred that the optical path length adjusting films 151, 152 and 153 are formed of the same material.

In addition, the film thickness of the optical path length adjusting film 151 is 20 nm or more and 40 nm or less, the film thickness of the optical path length adjusting film 152 is 50 nm or more and 70 nm or less, and the film thickness of the optical path length adjusting film 153 is 20 nm or more and 40 nm or less. The film thickness of the optical path length adjusting film 152 is larger than each of the film thicknesses of the optical path length adjusting film 151 and the optical path length adjusting film 153, and the film thicknesses of the optical path length adjusting film 151 and the optical path length adjusting film 153 are preferably the same.

In addition, for example, fluoride such as LiF or silicon oxide and the like can be used as the optical path length adjusting film 154. The refractive index of the optical path length adjusting film is preferably 1.0 to 1.5 for example. The film thickness of the optical path length adjusting film 154 is 30 nm or more and 120 nm or less.

Figure 12:
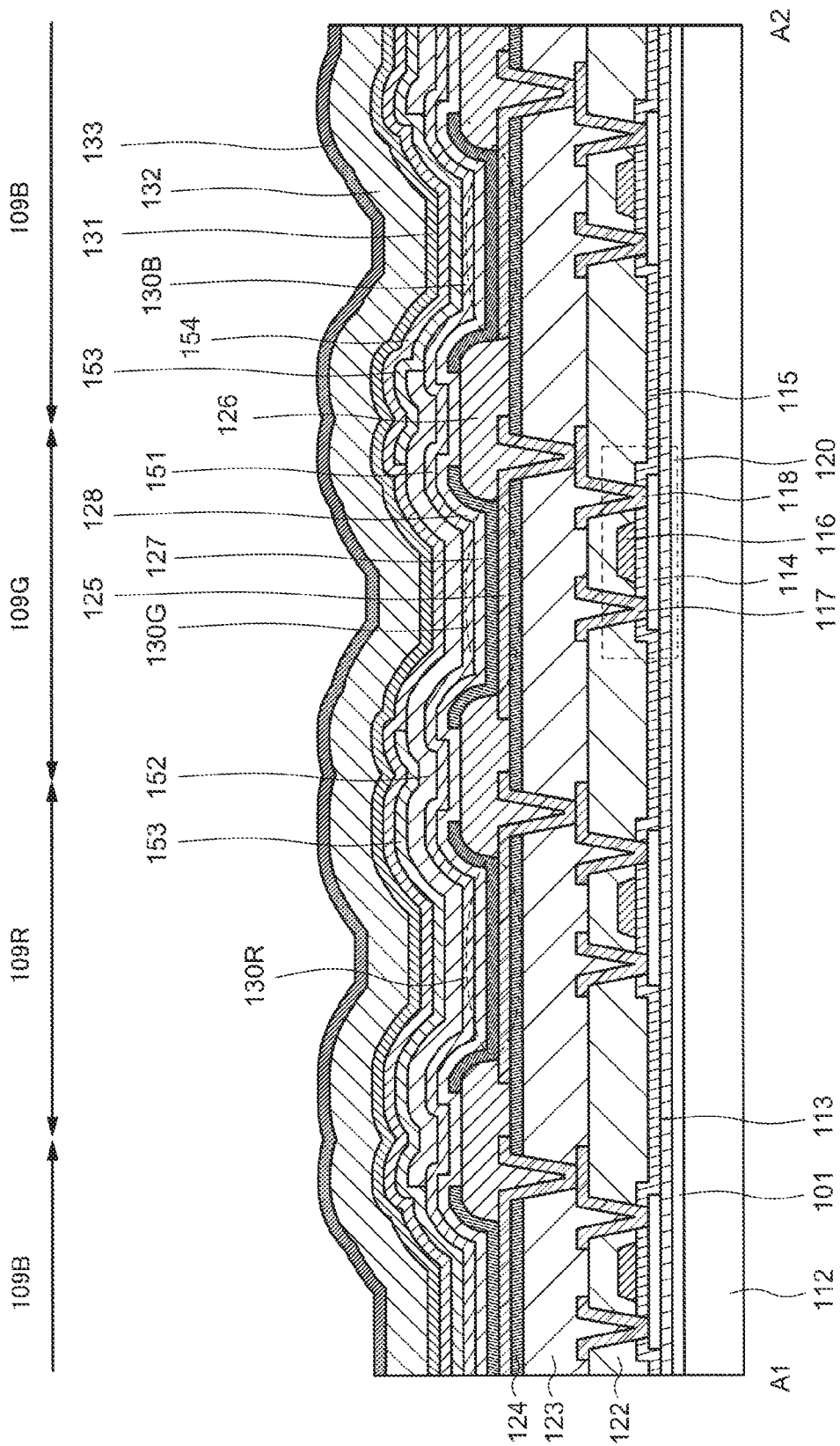
FIG. 12 is a cross-sectional view for explaining a manufacturing method of a display device related to one embodiment of the present invention.

As shown in FIG. 12, a first inorganic insulating layer 131, an organic insulating layer 132, and a second inorganic insulating layer 133 are formed above the display region 103. The first inorganic insulating layer 131, the organic insulating layer 132 and the second inorganic insulating layer 133 function as a sealing film for preventing moisture and oxygen from entering the light emitting element 130. By arranging a sealing film above the display region 103, it is possible to prevent moisture and oxygen from entering the light emitting element 130, and it is possible to improve the reliability of the display device. A film of silicon nitride ($Si_xN_y$), silicon oxynitride ($SiO_xN_y$), silicon nitride oxide ($SiN_xO_y$), aluminum oxide ($Al_xO_y$), aluminum nitride ($Al_xN_y$), aluminum nitride ($Al_xO_yN_z$)), aluminum nitride oxide ($Al_xN_yO_z$) or the like can be used as the first inorganic insulating layer 131 and the second inorganic insulating layer 133 (x, y, z are arbitrary). A polyimide resin, an acrylic resin, an epoxy resin, a silicone resin, a fluororesin and a siloxane resin or the like can be used as the organic insulating layer 132.

Figure 13:
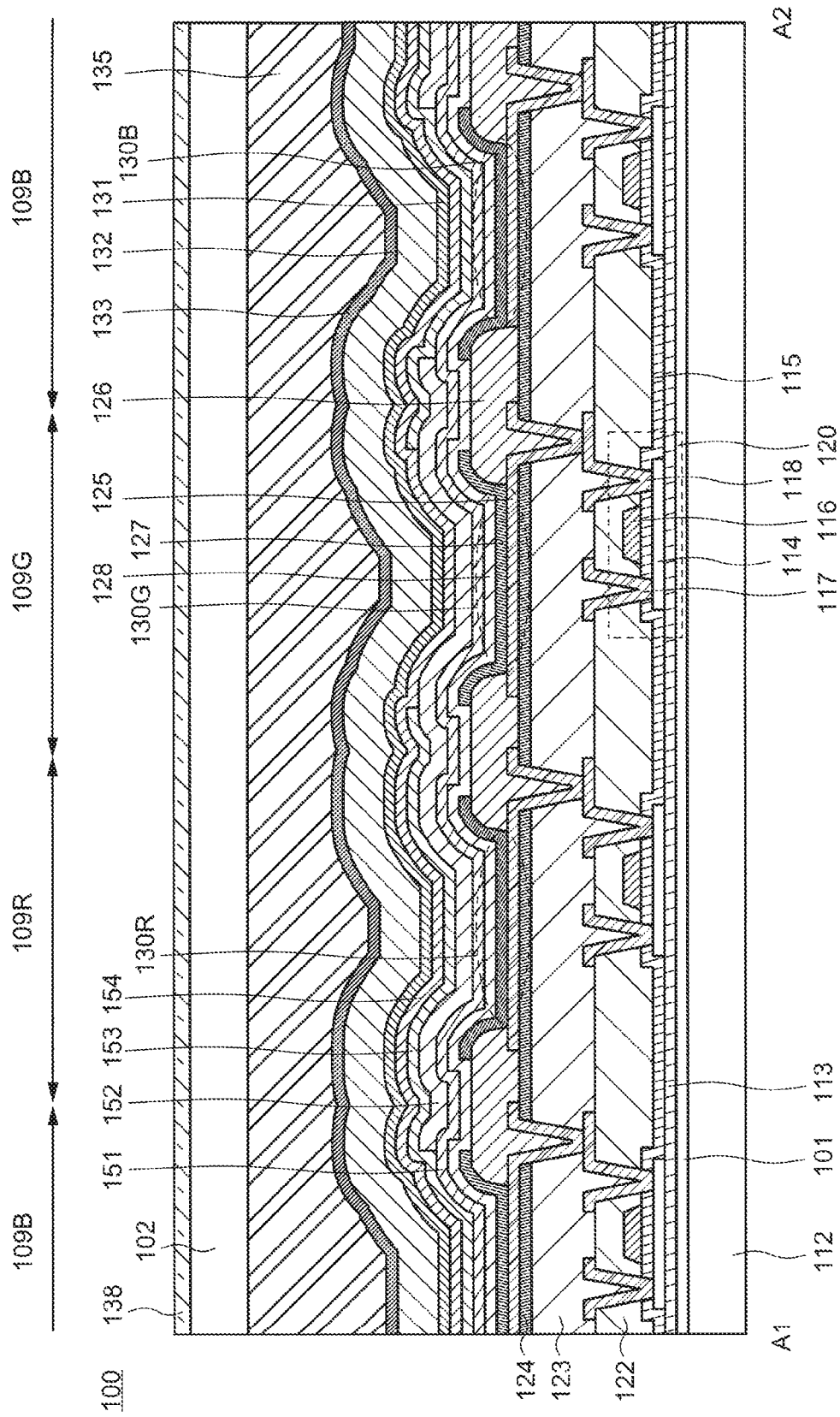
FIG. 13 is a cross-sectional view for explaining a manufacturing method of a display device related to one embodiment of the present invention.

As shown in FIG. 13, the counter substrate 102 is bonded above the second inorganic insulating layer 133 by an adhesive material 135. For example, an acrylic type, rubber type, silicone type or urethane type adhesive material can be used as the adhesive material 135. In addition, the adhesive material 135 may contain moisture absorbing substances such as calcium and zeolite. By containing a moisture absorbing substance in the adhesive material 135, even when moisture enters into the display device 100, it is possible to delay the arrival of moisture to the light emitting element 130. In addition, a spacer may be arranged on the adhesive material 135 in order to secure a gap between the first substrate 101 and the counter substrate 102. This spacer may be mixed with the adhesive material 135 or may be formed of a resin or the like on the first substrate 101. In addition, the same material as the materials exemplified for the first substrate 101 and the second substrate 112 can be used as the counter substrate 102.

For example, an overcoat layer may be arranged on the counter substrate 102 for flattening. In the case when an organic layer emits white light, a color filter corresponding to each RGB color and a black matrix arranged between the color filters may be arranged on a main surface (surface facing the first substrate 101) on the counter substrate 102. In the case when a color filter is not formed on the counter substrate 102 side, for example, a color filter may be directly formed on the sealing film and the adhesive 135 may be formed thereon. A polarization plate 138 is arranged on the rear surface (display surface side) of the counter substrate 102.

As explained above, a structure is obtained in which the optical path length adjusting film having the high refractive index is divided into three patterns and arranged above light emitting elements of a plurality of colors. In this way, even if the optical path length adjusting film is divided into three patterns for each color and an optimum film thickness for the light emitting elements of each color is not provided, it is possible to arrange the optical path length adjusting film having the optimum film thickness for light emitting elements of each color.

In addition, as shown in the present embodiment, by arranging the optical path length adjusting films divided into three patterns above the light emitting elements of a plurality of colors, it is possible to form the optical path length adjusting film having an optimum film thickness for each color even when a pixel unit mask is not used. In this way, it is possible to expand the process margin of the display device. That is, it is possible to provide a manufacturing method of a display device with an expanded process margin while maintaining the same characteristics as in the case where the optical path length adjusting films having different film thicknesses are separately coated for each light emitting element of each color.

What is claimed is:

1. A display device comprising:
a display region arranged above a substrate;
first light emitting elements emitting light of a first color, second light emitting elements emitting light of a second color, and third light emitting elements emitting light of a third color arranged in the display region; and
first optical path length adjustment films and second optical path length adjustment films, in the display region,
wherein
the first color, the second color and the third color are different colors from each other,
each of the first optical path length adjustment films has a first region overlapping one of the first light emitting elements and the second light emitting elements without overlapping the third light emitting elements;
each of the second optical path length adjustment films has a second region overlapping one of the third light emitting elements without overlapping the second light emitting elements.

2. The display device according to claim 1, wherein the second region overlaps one of the first light emitting elements.

3. The display device according to claim 2, the first region continuously overlaps the one of the first light emitting elements and the second light emitting elements, and the second region continuously overlaps one of the first light emitting elements and one of the third light emitting elements.

4. The display device according to claim 1, wherein the first region continuously overlaps the one of the first light emitting elements and the second light emitting elements.

5. The display device according to claim 1, wherein one of the first optical path length adjustment films overlaps the second optical path length adjustment films.

6. The display device according to claim 1, wherein each of the first optical path length adjustment films has a protruding part overlapping one of the first light emitting elements.

7. The display device according to claim 6, wherein each of the first optical path length adjustment films has a straight line overlapping at least two of the second light emitting elements, and the protruding part protrudes from the straight line.

8. The display device according to claim 6, wherein one of the second optical path length adjustment films overlaps the protruding part.

9. The display device according to claim 8, wherein the line overlaps one of the second optical path length adjustment films.

10. The display device according to claim 1, wherein each of the first optical path length adjustment films has protruding parts.

11. The display device according to claim 10, wherein one of the second optical path length adjustment films overlaps the protruding parts.

12. The display device according to claim 1, further comprising
a third optical path length adjustment film, wherein the third optical path length adjustment film overlaps the first light emitting elements, the second light emitting elements and the third light emitting elements.

13. The display device according to claim 12, wherein a film thickness of the first optical path length adjustment films are thicker than a film thickness of the third optical path length adjustment films and the second optical path length adjustment films.

14. The display device according to claim 12, further comprising:
a fourth optical path length adjustment film above the first to third optical path length adjustment films, wherein
a first refractive index of the first optical path length adjustment films, a second refractive index of the second optical path length adjustment films are the same, and
a forth refractive index of the fourth optical path length adjustment film is lower than the first refractive index and the second refractive index.

15. The display device according to claim 1, wherein a first refractive index of the first optical path length adjustment films, a second refractive index of the second optical path length adjustment films are the same.

* * * * *